(12) United States Patent  
Ishii (10) Patent No.: US 12,456,665 B2  
(45) Date of Patent: Oct. 28, 2025

(54) RESIN-SEALED SEMICONDUCTOR DEVICE AND METHOD FOR MANUFACTURING RESIN-SEALED SEMICONDUCTOR DEVICE

(71) Applicant: Mitsubishi Electric Corporation, Tokyo (JP)

(72) Inventor: Ryuichi Ishii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 451 days.

(21) Appl. No.: 17/886,002

(22) Filed: Aug. 11, 2022

(65) Prior Publication Data

US 2023/0132513 A1    May 4, 2023

(30) Foreign Application Priority Data

Nov. 2, 2021  (JP) ................................. 2021-179156

(51) Int. Cl.
*H01L 23/495* (2006.01)
*H01L 21/56* (2006.01)
(Continued)

(52) U.S. Cl.
CPC ........ *H01L 23/49548* (2013.01); *H01L 21/56* (2013.01); *H01L 23/3121* (2013.01);
(Continued)

(58) Field of Classification Search
CPC . H01L 23/48; H01L 23/495; H01L 23/49558; H01L 23/49568; H01L 23/49575; H01L 23/49576; H01L 23/49579; H01L 23/49541–49565; H01L 23/49838–49844; H01L 2224/26175; H01L 2224/29111; H01L 2224/29139;
(Continued)

(56) References Cited

U.S. PATENT DOCUMENTS 9,059,385 B2 * 6/2015 Yoon ..................... H01L 33/62
2013/0154070 A1 * 6/2013 Kim ...................... H01L 21/563
257/E23.051

(Continued)

FOREIGN PATENT DOCUMENTS

JP   2006-202885 A   8/2006
JP   2008-108886 A   5/2008

(Continued)

OTHER PUBLICATIONS

Office Action issued Dec. 13, 2022 in Japanese Application No. 2021-179156.

*Primary Examiner* — Julio J Maldonado
*Assistant Examiner* — Stanetta D Isaac
(74) *Attorney, Agent, or Firm* — Sughrue Mion, PLLC (57) ABSTRACT

Provided is a resin-sealed semiconductor device that can regulate the thickness of a joining material joining a semiconductor element and a lead frame and inhibit the joining material from leaking out of a proper range. The resin-sealed semiconductor device includes a second lead frame joined via a second joining material above a semiconductor element joined above a heat spreader. The second lead frame has, on a surface thereof opposed to the semiconductor element, a protrusion to regulate a thickness of the second joining material, and a groove formed at a peripheral part of the second joining material.

12 Claims, 6 Drawing Sheets

(51) Int. Cl.
  *H01L 23/00* (2006.01)
  *H01L 23/31* (2006.01)
  *H01L 25/07* (2006.01)
  *H01L 25/18* (2023.01)

(52) U.S. Cl.
  CPC .. *H01L 23/49513* (2013.01); *H01L 23/49537* (2013.01); *H01L 23/49568* (2013.01); *H01L 23/49575* (2013.01); *H01L 24/26* (2013.01); *H01L 24/29* (2013.01); *H01L 24/32* (2013.01); *H01L 24/33* (2013.01); *H01L 24/83* (2013.01); *H01L 25/072* (2013.01); *H01L 25/18* (2013.01); *H01L 2224/26175* (2013.01); *H01L 2224/29111* (2013.01); *H01L 2224/29139* (2013.01); *H01L 2224/29144* (2013.01); *H01L 2224/29147* (2013.01); *H01L 2224/32057* (2013.01); *H01L 2224/32245* (2013.01); *H01L 2224/3303* (2013.01); *H01L 2224/33181* (2013.01); *H01L 2224/83815* (2013.01); *H01L 2924/01032* (2013.01); *H01L 2924/0132* (2013.01); *H01L 2924/10253* (2013.01); *H01L 2924/10254* (2013.01); *H01L 2924/10272* (2013.01); *H01L 2924/1033* (2013.01); *H01L 2924/1203* (2013.01); *H01L 2924/13055* (2013.01); *H01L 2924/13091* (2013.01)

(58) Field of Classification Search
  CPC . H01L 2224/29144; H01L 2224/29147; H01L 2224/32057; H01L 2224/32245; H01L 2224/3303; H01L 2224/33181; H01L 2224/83815; H01L 2224/80935; H01L 23/49548; H01L 23/3121; H01L 23/49513; H01L 23/49537; H01L 23/562; H01L 23/4334; H01L 23/3107
  See application file for complete search history.

(56) References Cited

U.S. PATENT DOCUMENTS

| | | | |
|---|---|---|---|
| 2014/0145193 | A1 | 5/2014 | Kadoguchi et al. |
| 2016/0307829 | A1 | 10/2016 | Kadoguchi et al. |
| 2018/0053712 | A1* | 2/2018 | St. Germain ....... H01L 21/4828 |
| 2018/0331022 | A1* | 11/2018 | Qin .................... H01L 23/49524 |
| 2019/0067165 | A1* | 2/2019 | Soda .................... H01L 23/495 |
| 2021/0249338 | A1* | 8/2021 | Lee ..................... H01L 23/4951 |

FOREIGN PATENT DOCUMENTS

| | | | |
|---|---|---|---|
| JP | 2013-12525 | A | 1/2013 |
| JP | 2013-187511 | A | 9/2013 |
| JP | 2016-146450 | A | 8/2016 |
| JP | 2020-188162 | A | 11/2020 |

* cited by examiner

RESIN-SEALED SEMICONDUCTOR DEVICE AND METHOD FOR MANUFACTURING RESIN-SEALED SEMICONDUCTOR DEVICE

BACKGROUND OF THE INVENTION

1. Field of the Invention

The present disclosure relates to a resin-sealed semiconductor device and a method for manufacturing a resin-sealed semiconductor device.

2. Description of the Background Art

Semiconductor devices with power semiconductor elements mounted thereon have increasingly had larger capacities. In order to apply large current to the power semiconductor element, the size of a lead frame serving as a main terminal needs to be enlarged. However, when the size of the lead frame is enlarged, a thermal deformation force caused by difference among linear expansion coefficients of the semiconductor element, the lead frame, and a joining material increases. Therefore, for the purpose of reducing the thermal deformation force, a sealing structure using mold resin is generally adopted in many cases.

Meanwhile, when the semiconductor element and a conductor member such as the lead frame are soldered to each other, surplus solder might overflow from between the semiconductor element and the conductor member. At this time, if the surplus solder wets and spreads toward the semiconductor element, this leads to failure such as short-circuit or insulation fault in the semiconductor element. Accordingly, disclosed is a configuration in which a groove for introducing the overflowed solder is provided so as to inhibit wetting and spreading of the solder (see, for example, Patent Document 1).

Patent Document 1: Japanese Laid-Open Patent Publication No. 2020-188162

In Patent Document 1, solder is interposed between a protruding surface of the conductor member and the semiconductor element, and a side surface of a protruding portion of the conductor member has a groove for inhibiting solder from widely covering the side surface, while the thickness of a solder layer is not regulated. Therefore, there is a possibility of causing variations in the thickness of a joining layer in a pressing step at the time of solder joining.

SUMMARY OF THE INVENTION

The present disclosure has been made to solve the above problem, and an object of the present disclosure is to provide a resin-sealed semiconductor device that can regulate the minimum thickness of a joining material and inhibit the joining material from leaking out of a proper range.

A resin-sealed semiconductor device according to the present disclosure includes: a semiconductor element; a heat spreader to which one surface of the semiconductor element is joined via a first joining material; a first lead frame joined to a surface, of the heat spreader, at which the semiconductor element is joined; a second lead frame joined to another surface of the semiconductor element via a second joining material; and mold resin sealing the first lead frame, the second lead frame, the semiconductor element, and the heat spreader together, such that a part of the first lead frame and a part of the second lead frame are exposed. The second lead frame has, on a surface thereof opposed to the semiconductor element, a protrusion to regulate a thickness of the second joining material, and a groove formed at a peripheral part of the second joining material.

In the resin-sealed semiconductor device according to the present disclosure, the thickness of the joining material joining the semiconductor element and the second lead frame can be regulated by the protrusion provided to the second lead frame, and wetting and spreading of the joining material can be inhibited by the groove provided to the second lead frame.

DETAILED DESCRIPTION OF THE PREFERRED EMBODIMENTS OF THE INVENTION

Hereinafter, embodiments of a resin-sealed semiconductor device according to the present disclosure will be described with reference to the drawings. In the drawings, the same reference characters denote the same or corresponding parts.

First Embodiment

Hereinafter, a resin-sealed semiconductor device according to the first embodiment will be described with reference to the drawings.

Figure 1:
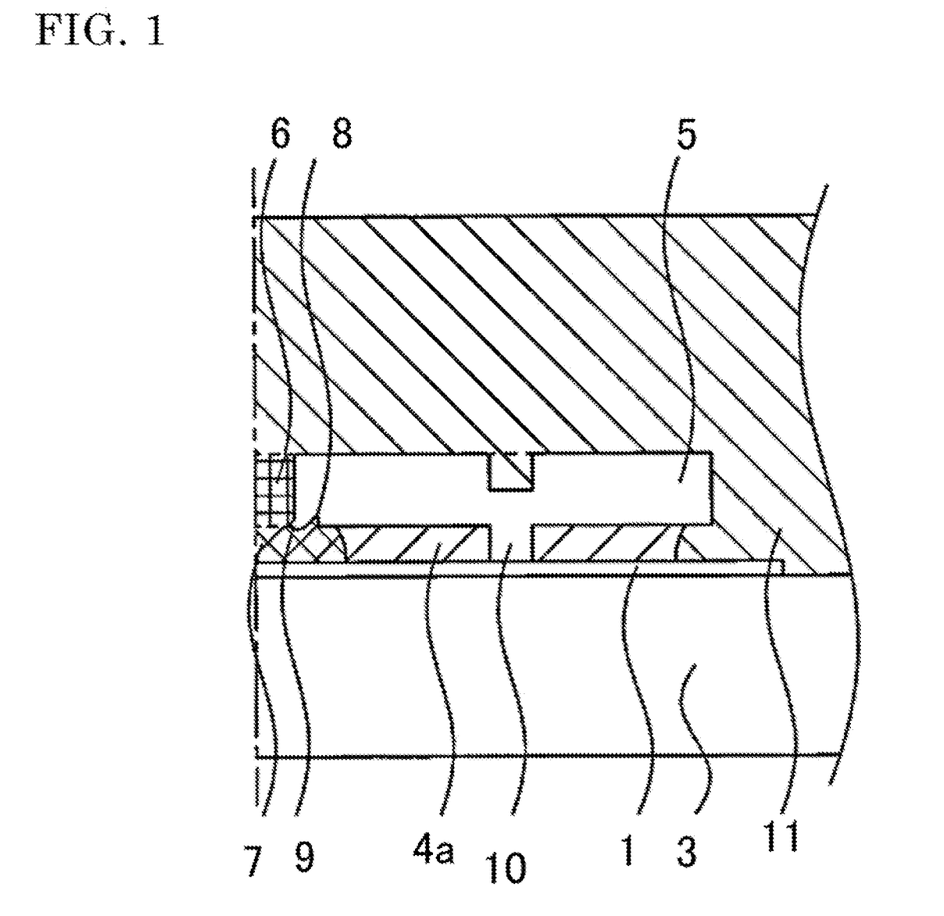
FIG. 1 is a partial sectional view schematically showing the structure of a resin-sealed semiconductor device according to the first embodiment of the present disclosure.
Figure 2:
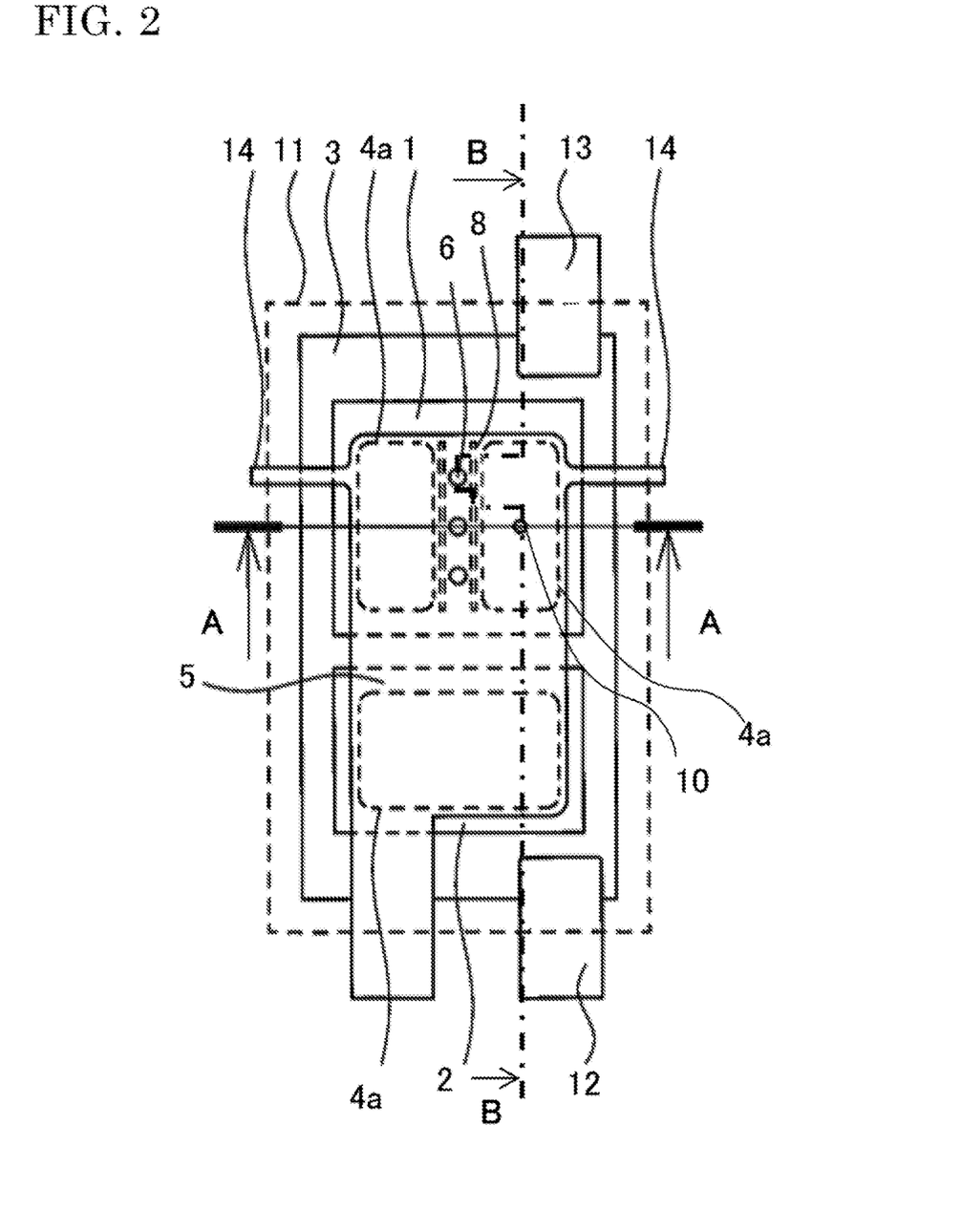
FIG. 2 is a plan view schematically showing the structure of the resin-sealed semiconductor device according to the first embodiment.

FIG. 1 is a partial sectional view schematically showing the structure of the resin-sealed semiconductor device according to the first embodiment, and FIG. 2 is a plan view schematically showing the resin-sealed semiconductor device. FIG. 1 corresponds to a part of a cross-section along line A-A in FIG. 2.

The resin-sealed semiconductor device (hereinafter, simply referred to as semiconductor device) includes a semiconductor element 1 as a switching element, a semiconductor element 2 as a rectification element, a heat spreader 3, first lead frames 12, 13, a second lead frame 5, and mold resin 11. The semiconductor element 1 as the switching element is joined to one surface of the heat spreader 3 via a below-chip joining material (see FIGS. 3A to 3C).

The semiconductor element 2 as the rectification element is joined to the one surface of the heat spreader 3 via a below-chip joining material. The first lead frames 12, 13 are joined to end portions of the one surface of the heat spreader 3 via lead joining materials (not shown). The lead joining materials are formed through joining by a solder joining material, ultrasonic metal welding, or the like so as to ensure electric conduction between the heat spreader 3 and the first lead frames 12, 13, thus joining the heat spreader 3 and the first lead frames 12, 13 integrally.

The second lead frame 5 has suspension portions 14 for keeping the height at the time of joining. The second lead frame 5 is joined to the semiconductor element 1 via an above-chip joining material 4a and joined to the semiconductor element 2 via an above-chip joining material 4a. In addition, the second lead frame 5 has opening holes 6, and a protrusion 10 for regulating a minimum thickness of the above-chip joining material 4a. The mold resin 11 is formed such that the semiconductor elements 1, 2, the heat spreader 3, the below-chip joining materials, parts of the first lead frames 12, 13, a part of the second lead frame 5, the lead joining materials, the opening holes 6 formed in the second lead frame 5, a below-opening area 7 which is an area below the opening holes 6, and the above-chip joining materials 4a are included inside and sealed against the outside. The first lead frames 12, 13 and the second lead frame 5 have parts exposed from the mold resin 11 and connected as terminals to the outside.

The semiconductor element 1 is formed by a semiconductor switching element such as an insulated gate bipolar transistor (IGBT) or a metal oxide semiconductor field effect transistor (MOSFET). The IGBT is an element for applying large current to a load and performing driving thereof. Preferably, the semiconductor elements 1, 2 are made of silicon (Si), for example, but is not limited thereto. For example, it is more preferable that semiconductor chips forming the semiconductor elements 1, 2 are made of any material selected from a group consisting of silicon carbide (SiC), a gallium-nitride-based material (e.g., gallium nitride (GaN)), and diamond. These materials are so-called wide bandgap semiconductor materials having wider bandgaps than silicon. The semiconductor elements 1, 2 formed using such a wide bandgap semiconductor material can be applied to operation at a higher temperature as compared to semiconductor elements using a silicon semiconductor material such as MOSFET. That is, the wide bandgap semiconductor materials are semiconductor materials suitable for applying large current.

The semiconductor element 1 has divided electrodes at an active surface thereof so that the temperature distribution on the active surface is uniform even when large current flows, and preferably has two or more divided electrodes.

Electrodes at active surfaces as front surface parts of the semiconductor elements 1, 2 are joined to the second lead frame 5 serving as main terminals, via the above-chip joining materials 4a made of solder joining material or the like, as described above.

In FIG. 2, it is found that there are two divided electrodes at the active surface of the semiconductor element 1 and the above-chip joining materials 4a are provided so as to correspond to the respective electrodes. The above-chip joining materials 4a are indicated by broken lines. The second lead frame 5 has, above an area between the two electrodes, the opening holes 6 so that the mold resin 11 can readily reach and fill the below-opening area 7 (see FIG. 1).

The heat spreader 3, the first lead frames 12, 13, and the second lead frame 5 are made of metal having high conductivity. Among highly conductive metals, a copper material is most suitable in terms of electric resistance, workability, cost, and the like. Here, the copper material refers to pure copper or a copper alloy mainly composed of copper.

The mold resin 11 sealing the entirety including the opening holes 6 of the second lead frame 5 and the below-opening area 7 is preferably resin having a linear expansion coefficient close to the linear expansion coefficients of the heat spreader 3, the first lead frames 12, 13, and the second lead frame 5 so that a thermal deformation force occurring due to difference among the linear expansion coefficients does not become great. The linear expansion coefficient of pure copper is 16 [ppm/K] to 17 [ppm/K]. Therefore, it is desirable that also the linear expansion coefficient of the mold resin 11 is 15 [ppm/K] to 18 [ppm/K].

Figure 3A:
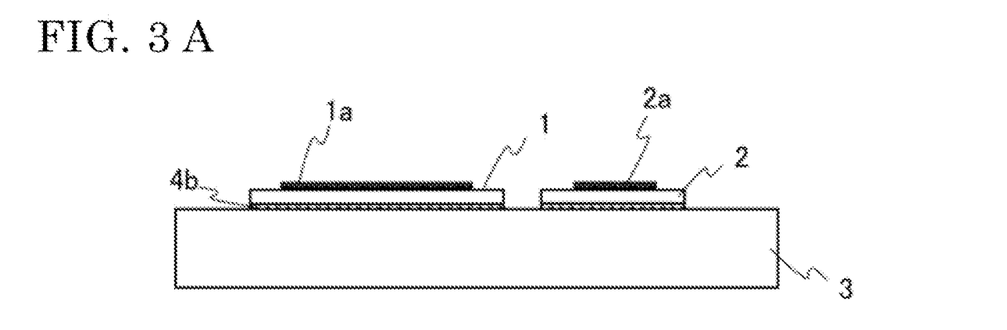
FIGS. 3A to 3C show a manufacturing process for the resin-sealed semiconductor device according to the first embodiment.
Figure 3B:
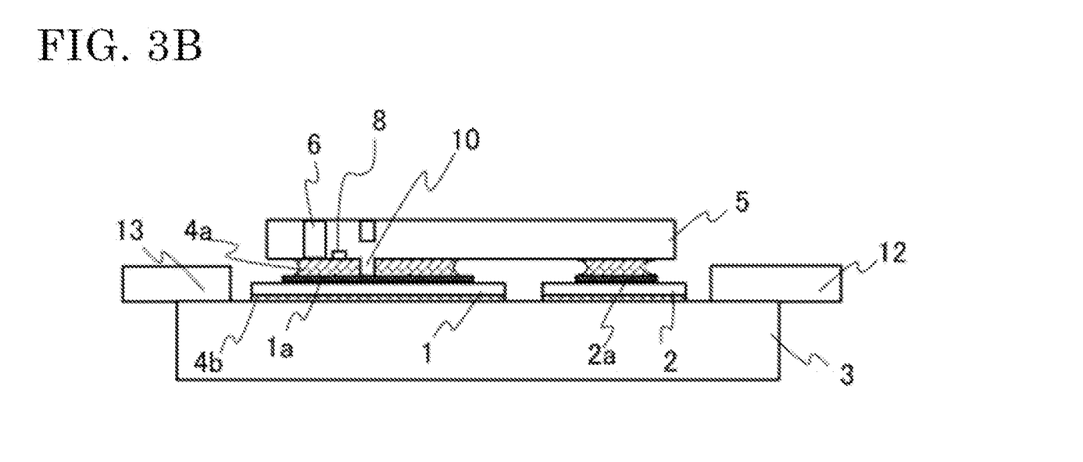
Figure 3C:
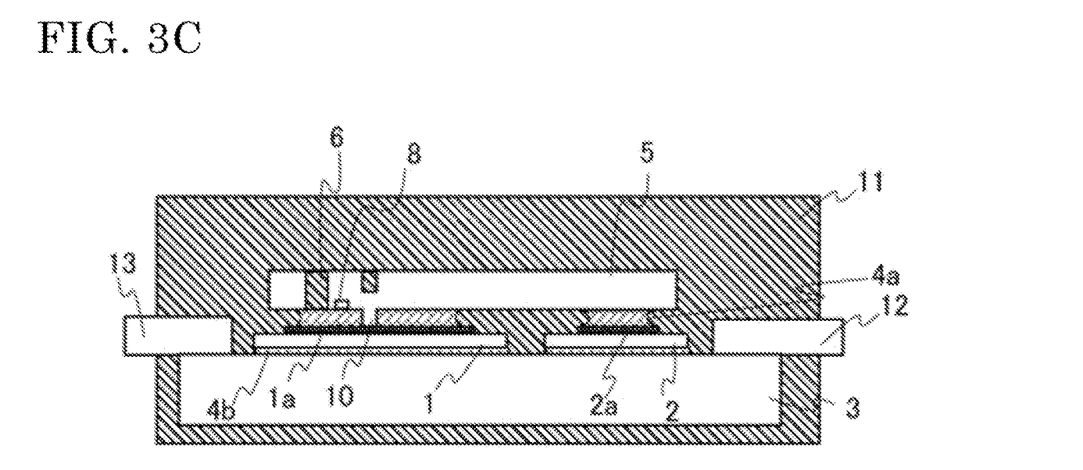

Next, a method for manufacturing the semiconductor device according to the first embodiment will be described with reference to FIGS. 3A to 3C. FIGS. 3A to 3C correspond to a sectional view along line B-B in FIG. 2.

First, in a die bonding step in FIG. 3A, the semiconductor element 1 as the switching element and the semiconductor element 2 as the rectification element are placed with an interval therebetween above one surface of the heat spreader 3, and are joined thereto via the below-chip joining materials 4b. The semiconductor element 1 as the switching element is, for example, made from silicon, and is formed as a semiconductor chip provided with an IGBT and having two divided electrodes at the active surface. In FIGS. 3A to 3C, only one electrode 1a is shown. The semiconductor element 2 as the rectification element is, for example, made of silicon, and is formed as a semiconductor chip provided with a diode and having one electrode at the active surface.

Preferably, the below-chip joining material 4b is any joining material selected from a group consisting of a solder joining material, a sintering-type filler mainly composed of silver, a brazing material mainly composed of silver, a material obtained by dispersing copper in tin, and gold-based alloys such as gold tin and gold germanium mainly composed of gold. These joining materials are joining materials having high thermal conductivity and high electrical conductivity.

Next, in a reflow step in FIG. 3B, the first lead frames 12, 13 serving as input/output terminals are connected to the heat spreader 3, using a lead joining material (not shown). The first lead frames 12, 13 are joined to end portions of the surface of the heat spreader 3 at which the semiconductor elements 1, 2 are mounted. In addition, the second lead frame 5 serving as main terminals is joined to the two electrodes 1a of the semiconductor element 1, using the above-chip joining material 4a, and is joined to the electrode 2a of the semiconductor element 2, using the above-chip joining material 4a. In FIG. 3B, only one electrode 1a of the two electrodes of the semiconductor element 1 is shown, but the second lead frame 5 is connected also to the other electrode as shown in FIG. 2.

For connection between the heat spreader 3 and the first lead frames 12, 13, the lead joining material (not shown) made of a solder joining material is used. However, without limitation thereto, a joining method such as ultrasonic joining or welding may be used.

It is desirable that the above-chip joining material 4a formed from a solder ribbon having a constant thickness is used for joining between the semiconductor elements 1, 2 and the second lead frame 5. If the stiffness of the above-chip joining material 4a is low, crack occurs. Therefore, it is desirable that the thickness of the above-chip joining material 4a is approximately 0.2 to 0.5 mm. However, because of manufacturing variations due to a thick solder ribbon, the volume might be changed by 10% or more. In addition, the second lead frame 5 is fixed using the suspension portions 14 so as to keep the distance between the second lead frame 5 and the semiconductor elements 1, 2, i.e., the height. Thus, warp occurs between the suspension portion 14 and the suspension portion 14, so as to form a valley shape with a reduced distance between the suspension portions 14, resulting in variations in the distance between the second lead frame 5 and the semiconductor elements 1, 2. Therefore, the second lead frame 5 needs to have the protrusion 10 in order to regulate the minimum thickness of the above-chip joining material 4a after the above-chip joining material 4a is melted.

On the other hand, the protrusion 10 provided to the second lead frame 5 is formed by press work and thus has height variations in a range of about 10%. For example, if the solder volume varies to increase and the height of the protrusion 10 varies to decrease, at the time of joining, solder which is the above-chip joining material 4a might flow outward along the surface direction of the second lead frame 5, i.e., flow to the outside of a proper range. Further, if the above-chip joining material 4a flows to an area between the two electrodes of the semiconductor element 1, this causes such a problem that the electrodes are electrically connected to each other, or the opening holes 6 of the second lead frame 5 formed between the electrodes are filled and therefore resin cannot enter the area between the electrodes in the next step.

The second lead frame 5 according to the first embodiment has, on a surface thereof opposed to the semiconductor element 1, the protrusion 10, and a groove 8 provided on a side at least toward the area between the two electrodes of the semiconductor element 1 from the protrusion 10 and toward the protrusion 10 side relative to the opening holes 6. The second lead frame 5 is placed on the above-chip joining materials 4a such that the grooves 8 are positioned on the outer peripheral side of the solder ribbons that are the above-chip joining materials 4a placed on the semiconductor elements 1, 2. When the above-chip joining material 4a is melted, a surplus above-chip joining material 4a between the second lead frame 5 and the semiconductor element 1 is introduced to the groove 8 along the surface of the second lead frame 5, so that the wetting speed of solder which is the above-chip joining material 4a is reduced and overflow thereof can be absorbed. That is, the groove 8 is a groove for preventing flow of solder.

Further, as shown in FIG. 1, a barrier 9 protruding toward the semiconductor element 1 side is provided between the groove 8 and the opening hole 6, for example, at an entrance of the opening hole 6. Thus, even if solder runs over the groove 8, the barrier 9 can prevent wetting and spreading of the solder, whereby the solder can be prevented from flowing into the opening hole 6.

The shape of the opening hole 6 formed in the second lead frame 5 exemplified in the present embodiment is a round shape. However, the shape may be freely set as long as the opening hole 6 penetrates the second lead frame 5 above the area between the electrodes of the semiconductor element 1.

The groove 8 formed in the second lead frame 5 has a triangular sectional shape and is formed in a straight shape. However, without limitation thereto, the shape, the position, and the length of the groove 8 may be freely set as long as the wetting speed of solder can be reduced and overflow thereof can be absorbed.

The barrier 9 provided to the second lead frame 5 is located at the entrance of the opening hole 6, as an example. However, the shape, the position, and the length of the barrier 9 may be freely set as long as solder can be prevented from flowing into the opening hole 6.

Next, in a transfer molding step in FIG. 3C, the semiconductor elements 1, 2, the heat spreader 3, parts of the first lead frames 12, 13, a part of the second lead frame 5 including the opening holes 6, the below-opening area 7, and the above-chip joining materials 4a are sealed by the mold resin 11 made of thermosetting resin.

The mold resin 11 need not have high thermal conductivity. Therefore, as an inorganic filler to be contained in the thermosetting resin such as epoxy resin, fused silica is most suitable among types of silicon oxide (silica) which has high fluidity when contained in thermosetting resin and whose linear expansion coefficient can be easily adjusted. In the resin-sealed semiconductor device, a large amount of copper material is used. Therefore, stress inside the resin-sealed semiconductor device can be reduced by matching the linear expansion coefficient of the mold resin 11 to the linear expansion coefficient of copper, i.e., making the linear expansion coefficient of the mold resin 11 equal or approximate to the linear expansion coefficient of copper. Accordingly, the amount of the inorganic filler may be adjusted so that the linear expansion coefficient of the mold resin 11 becomes 15 [ppm/K] to 18 [ppm/K]. Such adjustment to match the linear expansion coefficients provides an effect of improving reliability for temperature cycling.

As described above, according to the first embodiment, the second lead frame 5 as main terminals connected to the semiconductor element 1 having two electrodes via the above-chip joining materials 4a has, on the side opposed to the semiconductor element 1, the protrusion 10, the opening holes 6 between the two electrodes, and the groove 8 between the protrusion 10 and the opening holes 6. Thus, the thickness of the above-chip joining material 4a when melted can be regulated by the protrusion 10, and even if a surplus above-chip joining material 4a flows to the opening hole 6 side, the groove 8 can reduce the wetting speed and absorb the surplus above-chip joining material 4a. Further, the barrier 9 is provided between the opening hole 6 and the groove 8 of the second lead frame 5, whereby the barrier 9 prevents wetting and spreading of the above-chip joining material 4a running over the groove 8, thus preventing the above-chip joining material 4a from flowing into the opening hole 6.

As described above, the structure is made such that the thickness of the above-chip joining material 4a can be regulated and the above-chip joining material 4a can be inhibited from leaking out of a proper range, whereby it becomes possible to completely fill the space including the opening hole 6 and the below-opening area 7, with the mold resin 11. Thus, increase in stress occurring in the semiconductor element 1 and the above-chip joining material 4a can be prevented, and occurrence of crack in the above-chip joining material 4a and the semiconductor element 1 is suppressed, whereby it is possible to provide a resin-sealed semiconductor device having a high quality and a reduced size at low cost.

Second Embodiment

Hereinafter, a semiconductor device according to the second embodiment will be described with reference to the drawings.

Figure 4:
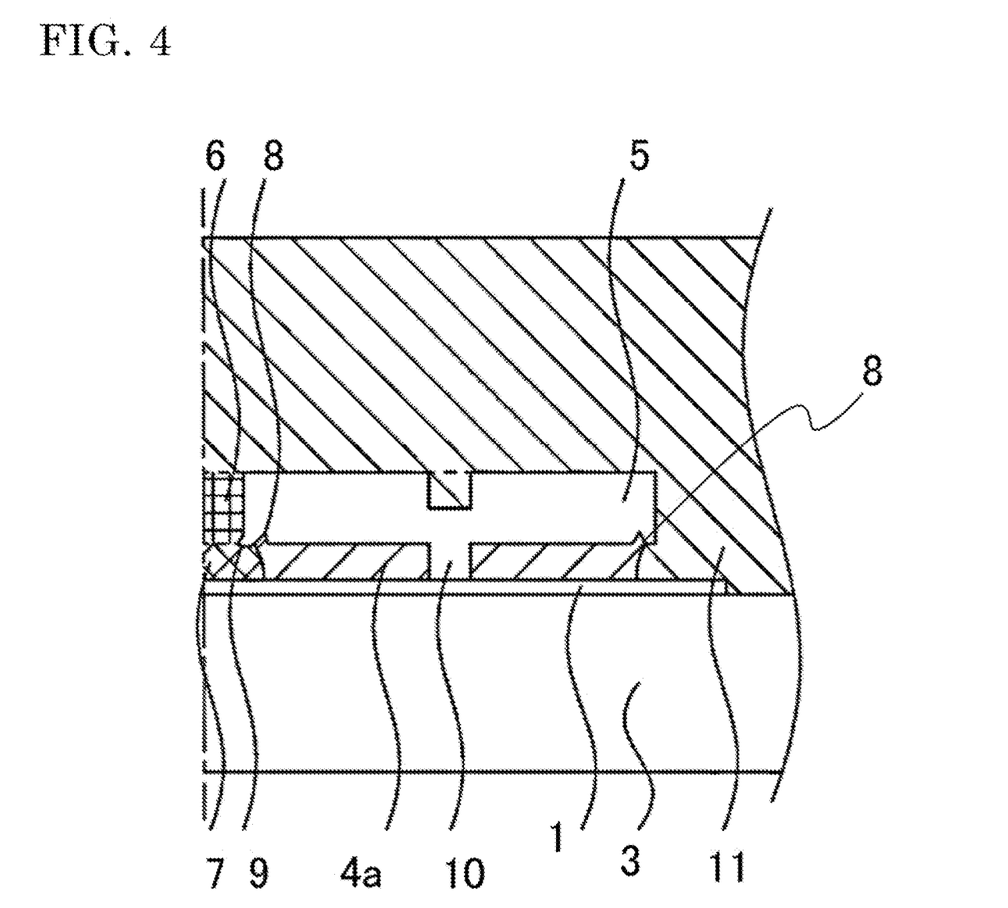
FIG. 4 is a partial sectional view schematically showing the structure of a resin-sealed semiconductor device according to the second embodiment of the present disclosure.
Figure 5:
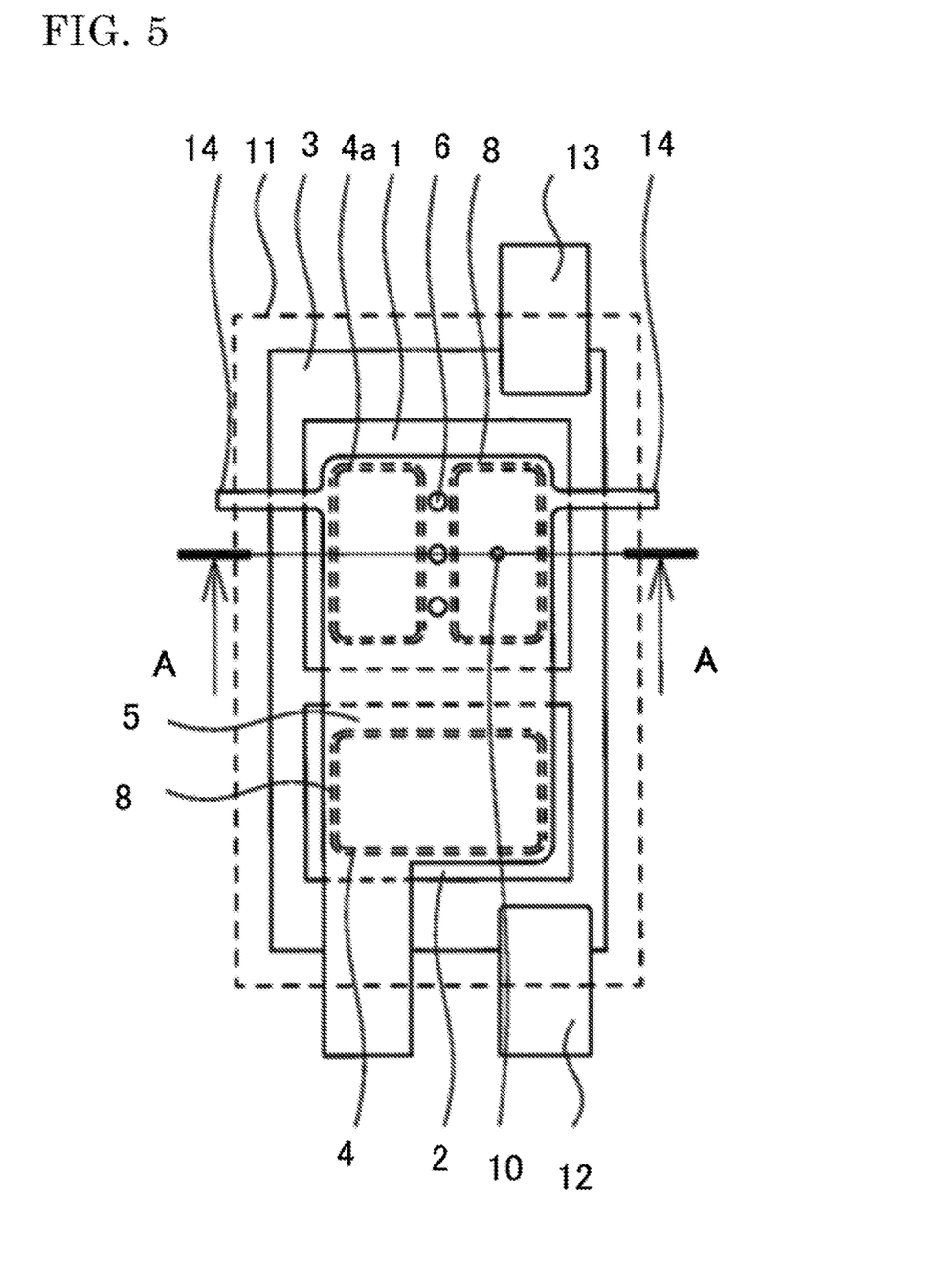
FIG. 5 is a plan view schematically showing the structure of the resin-sealed semiconductor device according to the second embodiment.

FIG. 4 is a partial sectional view schematically showing the structure of the semiconductor device according to the second embodiment, and FIG. 5 is a plan view schematically showing the semiconductor device. FIG. 4 corresponds to a part of a cross-section along line A-A in FIG. 5. In the first embodiment, the second lead frame 5 has, on the side opposed to the semiconductor element 1, the protrusion 10, the opening holes 6 between the two electrodes, and the groove 8 between the protrusion 10 and the opening holes 6, whereas the second embodiment is different in that the second lead frame 5 has grooves 8 along the peripheries of the above-chip joining materials 4a on the side opposed to the semiconductor element 1 and the semiconductor element 2. The grooves 8 in the second embodiment are formed along the outer peripheries of the areas where the above-chip joining materials 4a are provided in the manufacturing process. The other configurations are the same as those in the first embodiment, and the description thereof is omitted.

Also in the second embodiment, even if surplus melted solder flows out due to variations in the volume of the above-chip joining material 4a and the height of the protrusion 10, the flow of solder can be inhibited owing to the grooves 8 for preventing flow of solder, which are provided along the entire inner periphery correspondingly to the semiconductor element 1.

Further, the grooves 8 are provided along the entire outer peripheries of the areas where the above-chip joining materials 4a are provided. Thus, the joining angles between the above-chip joining materials 4a and the semiconductor elements 1, 2 can be controlled, and stress occurring in the semiconductor elements 1, 2 can be reduced. Hereinafter, stress occurring in the semiconductor element will be described with reference to FIG. 6.

Figure 6:
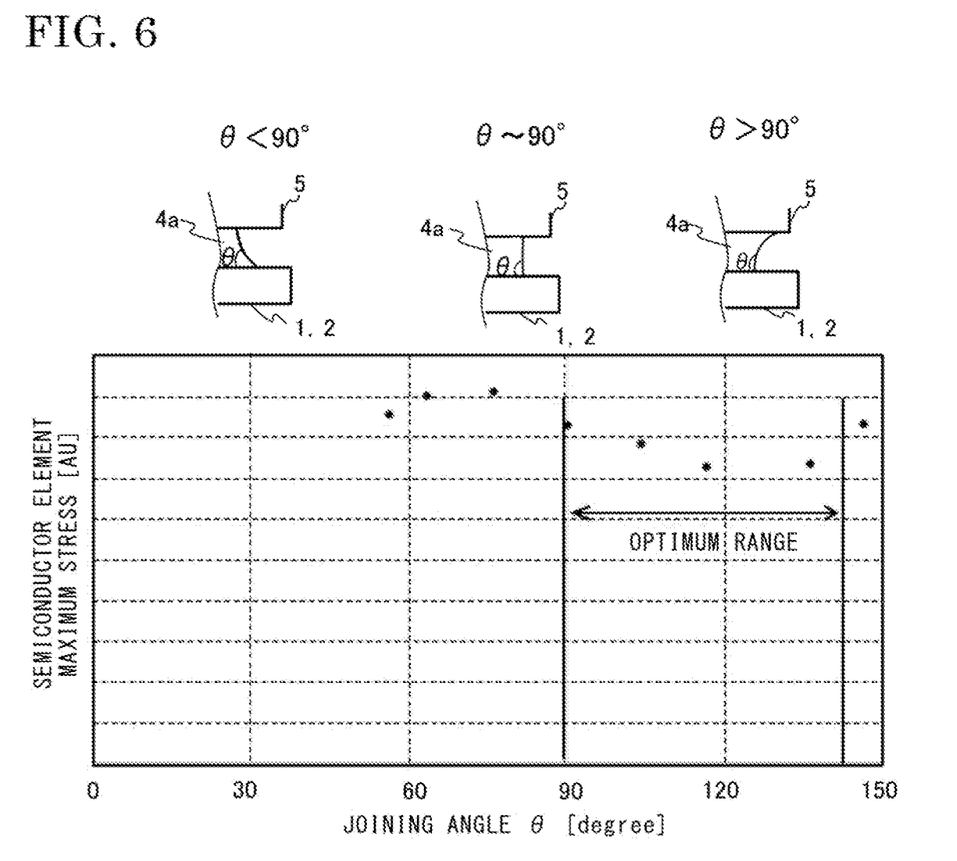
FIG. 6 shows a relationship between a joining angle of an above-chip joining material and maximum stress occurring in a semiconductor element in the resin-sealed semiconductor device according to the second embodiment.

FIG. 6 shows a relationship between the joining angle of the above-chip joining material and the maximum stress occurring in the semiconductor element in the semiconductor device according to the present embodiment. In FIG. 6, the maximum value of stress occurring in the semiconductor element when the semiconductor device has undergone repetitive temperature cycling from −45° C. to 150° C., has been calculated. Here, the joining angle is an angle $\theta$ of an end of the above-chip joining material 4a with respect to the semiconductor element 1, 2, as shown in FIG. 6.

The linear expansion coefficient of the semiconductor element 1, 2 is 3 [ppm/K] to 5 [ppm/K], the linear expansion coefficient of the below-chip joining material 4b is 18 [ppm/K] to 20 [ppm/K], the linear expansion coefficient of the above-chip joining material 4a is 21 [ppm/K] to 23 [ppm/K], the linear expansion coefficients of the heat spreader 3 and the second lead frame 5 are 16 [ppm/K] to 17 [ppm/K], and the linear expansion coefficient of the mold resin 11 is 15 [ppm/K] to 18 [ppm/K]. The linear expansion coefficient of the semiconductor element 1, 2 is smallest, and the linear expansion coefficient of the above-chip joining material 4a is greatest.

The semiconductor element 1, 2 is made from a semiconductor material, and the strength thereof is smallest in the semiconductor device. Therefore, it is necessary to reduce stress occurring in the semiconductor element 1, 2. In a case where the temperature of the resin-sealed semiconductor device is changed from a high temperature to a low temperature, a force is generated to greatly contract the above-chip joining material 4a relative to the semiconductor element 1, 2, so that the maximum stress occurs in the semiconductor element 1, 2. In a case where the joining angle $\theta$ of the above-chip joining material 4a is an acute angle, the joining area between the above-chip joining material 4a and the second lead frame 5 is small, and therefore a force to deform the above-chip joining material 4a only in the contracting direction occupies a major proportion.

In a case where the joining angle $\theta$ of the above-chip joining material 4a is 90° to 135°, the joining area between the above-chip joining material 4a and the second lead frame 5 increases, so that the ratio of a force to deform the above-chip joining material 4a in the expanding direction increases. As a result, the maximum stress occurring in the semiconductor element 1, 2 can be reduced. However, in a case where the joining angle of the above-chip joining material 4a is greater than 135°, the ratio of the deformation force in the expanding direction excessively increases, so that the maximum stress occurring in the semiconductor element 1, 2 increases. It is noted that, in a case where the temperature of the semiconductor device is changed from a low temperature to a high temperature, the force directions are merely reversed and the correlation between the joining angle $\theta$ of the above-chip joining material 4a and the maximum stress occurring in the semiconductor element 1, 2 does not change.

From the above, it is found that stress occurring in the semiconductor element 1, 2 can be reduced by setting the joining angle $\theta$ of the above-chip joining material 4a in a range of 90° to 135°.

Next, description will be given returning to the structure of the semiconductor element in the second embodiment shown in FIG. 4 and FIG. 5. For example, in a case where the above-chip joining material 4a formed from a solder ribbon having a constant thickness is used for joining between each semiconductor element 1, 2 and the second lead frame 5, and there are no variations in the volume of the above-chip joining material 4a and the height of the protrusion 10, the joining angle $\theta$ of the above-chip joining material 4a becomes close to 90°. However, since there are variations in the volume of the above-chip joining material 4a and the height of the protrusion 10, the joining angle $\theta$ of the above-chip joining material 4a is changed. Here, the groove 8 for preventing flow of solder is provided along the entire periphery at such a contact position where the joining angle $\theta$ of the above-chip joining material 4a falls within the proper range of 90° to 135°. Surplus solder due to variations in the volume of the above-chip joining material 4a and the height of the protrusion 10 is introduced to the groove 8 along the surface of the second lead frame. Thus, the joining angle $\theta$ of the above-chip joining material 4a can be controlled in the proper range of 90° to 135°. That is, as shown in FIG. 4, the position of the groove 8 provided toward the outer peripheral side relative to the position where the above-chip joining material 4a and the semiconductor element 1 contact with each other is the joining position between the above-chip joining material 4a and the second lead frame 5. Thus, the joining angle $\theta$ of the above-chip joining material 4a can be set in the proper range.

Also in the second embodiment, as a matter of course, the barrier 9 is provided between the groove 8 and the opening hole 6 of the second lead frame 5, whereby the barrier 9 prevents wetting and spreading of the above-chip joining material 4a running over the groove 8, thus preventing the above-chip joining material 4a from flowing into the opening hole 6.

As described above, the semiconductor device according to the second embodiment provides the same effects as in the first embodiment. Further, on the outer peripheral side relative to the position where the above-chip joining material 4a and the semiconductor element 1 contact with each other, the groove 8 is provided along the entire periphery of the above-chip joining material 4a, whereby it becomes possible to control the joining angle $\theta$ of the above-chip joining material 4a in the proper range of 90° to 135°. Thus, stress occurring in each semiconductor element 1, 2 can be reduced and occurrence of crack can be further suppressed, whereby it is possible to provide a resin-sealed semiconductor device having a high quality and a reduced size at low cost.

OTHER EMBODIMENTS (1) The first and second embodiments have shown the examples in which the second lead frame 5 has one protrusion 10 on the side opposed to the semiconductor element 1. However, the present disclosure is not limited thereto. The protrusions 10 may be provided for the respective two electrodes of the semiconductor element 1. Further, the protrusion 10 may be provided so as to be opposed to the semiconductor element 2.

(2) The first and second embodiments have shown the examples in which the second lead frame 5 has the opening holes 6 at positions corresponding to the area between the two electrodes of the semiconductor element 1. However, the present disclosure is not limited thereto. In a case where the area of the second lead frame 5 is large, for example, the opening holes 6 may be also provided between the plurality of semiconductor elements 1, 2 so as not to produce a part that is not sealed. In addition, in a case where the semiconductor element 1 has three or more electrodes, the opening holes 6 may be provided between adjacent electrodes.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 semiconductor element
1*a* electrode
2 semiconductor element
2*a* electrode
3 heat spreader
4*a* above-chip joining material
4*b* below-chip joining material
5 second lead frame
6 opening hole
7 below-opening area
8 groove
9 barrier
10 protrusion
11 mold resin
12, 13 first lead frame
14 suspension portion

What is claimed is:
1. A resin-sealed semiconductor device comprising:
a semiconductor element;
a heat spreader to which a first surface of the semiconductor element is joined via a first joining material;
a first lead frame joined to a surface of the heat spreader on which the semiconductor element is joined;
a second lead frame joined to a second surface of the semiconductor element via a second joining material; and
mold resin sealing the first lead frame, the second lead frame, the semiconductor element, and the heat spreader together, such that a part of the first lead frame and a part of the second lead frame are exposed, wherein
the second lead frame has, on a surface thereof facing the semiconductor element and that the second joining material contacts,
a protrusion to regulate a thickness of the second joining material, and
a groove formed into the surface of the second lead frame facing the semiconductor element and at a peripheral part of the second joining material to receive the second joining material or a surplus of the second joining material.

2. The resin-sealed semiconductor device according to claim 1, wherein
the second lead frame further has
an opening hole filled with the mold resin, and
a barrier provided between the opening hole and the groove, and on the surface of the second lead frame facing the semiconductor element, so as to protrude toward the semiconductor element side.

3. The resin-sealed semiconductor device according to claim 2, wherein
the semiconductor element has a plurality of electrodes on the second surface thereof, and
the opening hole is provided between adjacent ones of the plurality of electrodes.

4. The resin-sealed semiconductor device according to claim 3, wherein
the groove of the second lead frame is provided along an outer periphery of the second joining material.

5. The resin-sealed semiconductor device according to claim 3, wherein
the semiconductor element is a switching element.

6. The resin-sealed semiconductor device according to claim 4, wherein
the semiconductor element is a switching element.

7. The resin-sealed semiconductor device according to claim 2, wherein
the groove of the second lead frame is provided along an outer periphery of the second joining material.

8. The resin-sealed semiconductor device according to claim 1, wherein
the groove of the second lead frame is provided along an outer periphery of the second joining material.

9. The resin-sealed semiconductor device according to claim 2, wherein
the semiconductor element is a switching element.

10. The resin-sealed semiconductor device according to claim 8, wherein
the semiconductor element is a switching element.

11. The resin-sealed semiconductor device according to claim 7, wherein
the semiconductor element is a switching element.

12. The resin-sealed semiconductor device according to claim 1, wherein
the semiconductor element is a switching element.

* * * * *